(12) United States Patent
Blaesing-Bangert

(10) Patent No.: US 11,243,464 B2
(45) Date of Patent: Feb. 8, 2022

(54) METHOD AND APPARATUS FOR TRANSFORMING MEASUREMENT DATA OF A PHOTOLITHOGRAPHIC MASK FOR THE EUV RANGE FROM FIRST SURROUNDINGS INTO SECOND SURROUNDINGS

(71) Applicant: Carl Zeiss SMT GmbH, Oberkochen (DE)

(72) Inventor: Carola Blaesing-Bangert, Rothenstein (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 239 days.

(21) Appl. No.: 16/547,662

(22) Filed: Aug. 22, 2019

(65) Prior Publication Data

US 2019/0377256 A1    Dec. 12, 2019

Related U.S. Application Data

(63) Continuation of application No. PCT/EP2018/052883, filed on Feb. 6, 2018.

(30) Foreign Application Priority Data

Feb. 23, 2017 (DE) .......................... 102017202945.5

(51) Int. Cl.
*G03F 1/84* (2012.01)
*G03F 7/20* (2006.01)
(Continued)

(52) U.S. Cl.
CPC .................. *G03F 1/84* (2013.01); *G03F 1/24* (2013.01); *G03F 1/38* (2013.01); *G03F 7/705* (2013.01);
(Continued)

(58) Field of Classification Search
CPC ... G03F 1/38; G03F 1/84; G03F 7/705; G03F 7/70783; G03F 7/70033; G03F 7/70283
(Continued)

(56) References Cited

U.S. PATENT DOCUMENTS

2004/0041102 A1    3/2004   Kamm
2005/0167514 A1    8/2005   Kaushal et al.
(Continued)

FOREIGN PATENT DOCUMENTS

CN    1910517     2/2007   ............... G03F 1/00
DE    10239858    3/2004   ............... G03F 7/20
(Continued)

OTHER PUBLICATIONS

Ballman et al., "Error Analysis of Overlay Compensation Methodologies and Proposed Functional Tolerances for EUV Photomask Flatness," Photomask Japan 2016, Proc. of SPIE, vol. 9984, 99840S (May 10, 2016).
(Continued)

*Primary Examiner* — Hung Nguyen
(74) *Attorney, Agent, or Firm* — Fish & Richardson P.C.

(57) ABSTRACT

The present invention relates to a method for transforming measurement data of a photolithographic mask for the extreme ultraviolet (EUV) wavelength range from first surroundings into second surroundings. The method includes the steps of: (a) determining the measurement data for the photolithographic mask in the first surroundings, wherein the measurement data are influenced by the effects of internal stresses on the photolithographic mask; (b) ascertaining at least one change in the measurement data during the transition from the first surroundings into the second surroundings, in which change the effects of the internal stresses on the photolithographic mask are at least partly compensated; and (c) correcting the measurement data
(Continued)

determined in step (a) with the at least one change in the measurement data ascertained in step (b).

19 Claims, 10 Drawing Sheets

(51) Int. Cl.
*G03F 1/24* (2012.01)
*G03F 1/38* (2012.01)

(52) U.S. Cl.
CPC ...... *G03F 7/70033* (2013.01); *G03F 7/70283* (2013.01); *G03F 7/70783* (2013.01)

(58) Field of Classification Search
USPC ...................................................... 355/72–76
See application file for complete search history.

(56) References Cited

U.S. PATENT DOCUMENTS

| | | | |
|---|---|---|---|
| 2007/0103657 A1 | 5/2007 | Yoshitake et al. | |
| 2010/0081067 A1 | 4/2010 | Tanabe | |
| 2017/0269347 A1 | 9/2017 | Jäckel et al. | |

FOREIGN PATENT DOCUMENTS

| | | | |
|---|---|---|---|
| DE | 102004010002 | 9/2005 | ............... G03F 1/14 |
| DE | 102006052015 | 5/2007 | ............... G03F 9/00 |
| DE | 102006054820 | 5/2008 | ............... G03F 7/20 |
| DE | 102016204535 | 9/2017 | ............... G01B 9/04 |
| EP | 1 829 052 | 4/2008 | ............... G21K 1/06 |
| JP | 63-24113 | 2/1988 | ............. G01B 11/00 |
| JP | 2006-093403 | 4/2006 | ........... H01L 21/027 |
| JP | 2007-150287 | 6/2007 | ........... H01L 21/027 |
| JP | 2015-064477 | 4/2015 | ............... G03F 1/84 |
| JP | 2015064477 | * 4/2015 | ............... G03F 1/84 |

OTHER PUBLICATIONS

Butschke et al., "Determination of mask layer stress by placement metrology," *25th Annual BACUS Symposium on Photomask Technology*, Proc. of SPIE, vol. 5992, p. 59923U-1-59923U-12, (2005).
Taiwan Office Action for Taiwan Application No. 107105978 dated Nov. 12, 2018.
German Examination Report for German Application No. 10 2017 202 945.5 dated Oct. 18, 2017.
The Written Opinion of the International Searching Authority for International Application No. PCT/EP2018/052883 dated Jun. 1, 2018.
Cotte et al., "EUV Mask Image Placement—A Numerical Study," *EMLC 2005 (European Mask and Lithography Conference)* contribution, Jan. 31-Feb. 3, 2005, Dresden.
Kamo et al., "Light-shield border impact on the printability of extreme-ultraviolet mask," *Journal of Micro/Nanolithography, MEMS, and MOEMS*, vol. 10, No. 2, pp. 023001-1-023001-9 (Apr.-Jun. 2011).
Kamo et al., "Thin-absorber extreme-ultraviolet lithography mask with light-shield border for full-field scanner: flatness and image placement change through mask process," J. Micro/Nanolithography MEMS, and MOEMS, vol. 9, No. 2, p. 023005-1-023005-10 (Apr.-Jun. 2010).
T. Shoki et al., "Improvement of defects and flatness on extreme ultraviolet mask blanks", *J. Micro/Nanolith. MEMS MOEMS*, vol. 12, No. 2, pp. 021008-1-021008-6 (Apr.-Jun. 2013).
Vukkadala et al., "Overview of IP Error Compensation Techniques for EUVL," *26th European Mask and Lithography Conference*, Proc. of SPIE, vol. 7545, No. 1, pp. 75404-1-75404-11 (2010).

* cited by examiner

Fig. 3
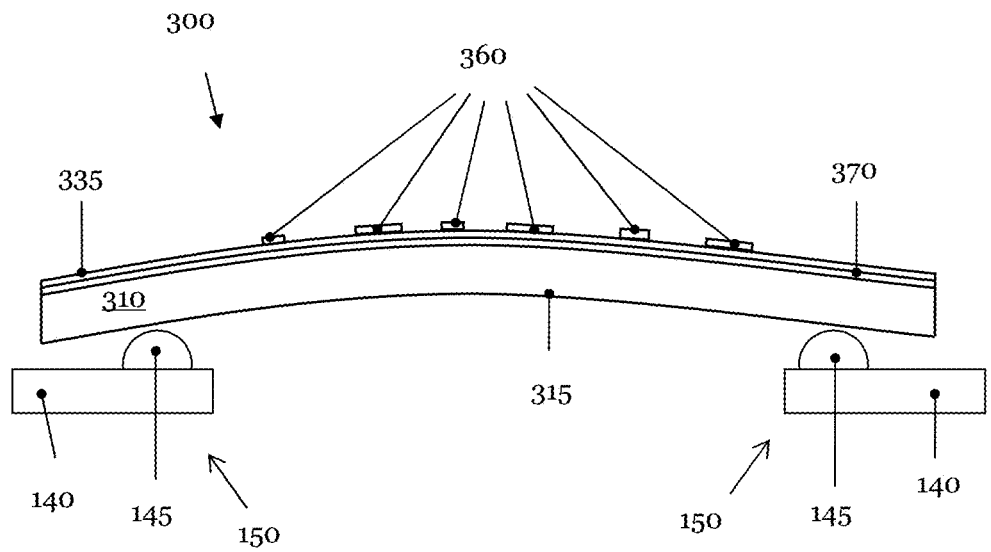
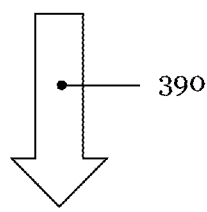
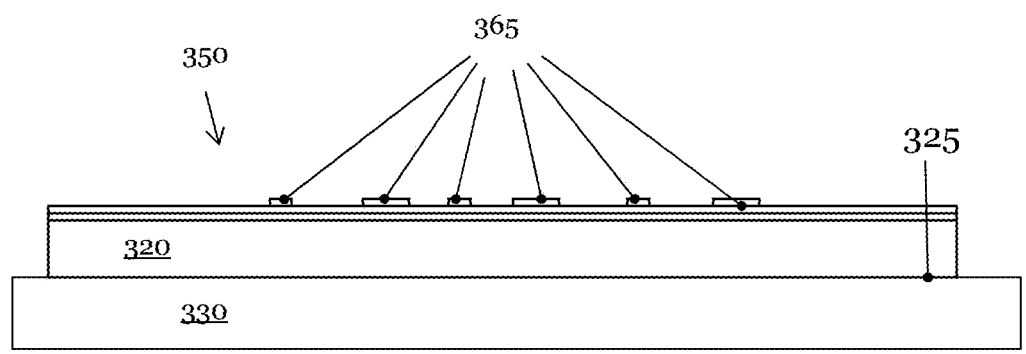

$$OPD_x = \Delta z * \tan\phi * M$$

$\Phi = 6°$ in the EUV scanner
M = Magnification factor (1/4)

Second order fit: $\Delta z(PV)= 107$ nm

Flatness after subtracting the 2$^{nd}$ order fit: $\Delta z(PV)$= 19 nm,
Maximum local gradients in X = 1.36 µrad, in Y = 0.66 µrad

METHOD AND APPARATUS FOR TRANSFORMING MEASUREMENT DATA OF A PHOTOLITHOGRAPHIC MASK FOR THE EUV RANGE FROM FIRST SURROUNDINGS INTO SECOND SURROUNDINGS

CROSS REFERENCE TO RELATED APPLICATIONS

This application is a continuation of and claims priority under 35 U.S.C. § 120 from PCT Application No. PCT/EP2018/052883, filed on Feb. 6, 2018, which claims priority from German Application No. DE 10 2017 202 945.5, filed on Feb. 23, 2017. The entire contents of each of these priority applications are incorporated herein by reference.

TECHNICAL FIELD

The present invention relates to a method and an apparatus for transforming measurement data of a photolithographic mask for an extreme ultraviolet (EUV) wavelength range from first surroundings into second surroundings.

BACKGROUND

As a consequence of the growing integration density in the semiconductor industry, photolithography masks have to image increasingly smaller structures on wafers. In order to take account of this trend, the exposure wavelength of lithography apparatuses is being shifted to ever shorter wavelengths. Future lithography systems will probably operate with wavelengths in the extreme ultraviolet (EUV) range (preferably but not necessarily in the range of 6 nm to 15 nm). The EUV wavelength range places huge demands on the precision of optical elements in the beam path of future lithography systems. In all probability, the optical elements, and hence also the photolithographic masks, will be reflective optical elements.

EUV masks have a substrate exhibiting little thermal expansion. A multilayer structure comprising, for example, approximately 20 to approximately 80 double layers comprising silicon (Si) and molybdenum (Mo), or other suitable materials, is applied to the substrate, said layers acting as a dielectric mirror. The European patent document EP 1 829 052 B1 discloses a possible exemplary embodiment of such a reflective multilayer system for the EUV wavelength range.

EUV photolithography masks, or simply EUV masks, additionally have an absorber structure made of absorbing and/or phase-shifting pattern elements on the multilayer structure. Incident EUV photons are absorbed and/or the phase thereof is retarded by a predetermined value in the regions of the EUV mask which are covered with pattern elements of the absorber structure and/or the phase-shifting structure.

EUV masks—or, in general, photomasks—are projection templates, the most important application of which is photolithography for producing semiconductor components, in particular integrated circuits. Photomasks must be largely error-free, since an error of the mask would reproduce on each wafer during each exposure. Therefore, the highest demands in respect of planar qualities, cleanliness, temperature stability, reflection constancy and freedom from errors are placed on the materials of the optical elements for the field of EUV lithography, in particular the photomasks.

In the case of a photomask, it is important that the pattern elements of the absorber structure on the photomask exactly image the structure elements predetermined by the design of the semiconductor component into the photoresist on a wafer.

The article "Improvement of defects and flatness on extreme ultraviolet mask blanks" by T. Shoki et al., J. Micro/Nanolith. MEMS MOEMS 12(2), 021008-1-021008-6 (April-June 2014) describes advances in the polishing process for substrates for EUV masks and when detecting local defects of EUV substrates and EUV mask blanks.

Due to their layered construction, photolithographic masks for the EUV wavelength range have internal stresses. Here, the multilayer structure typically supplies the largest individual contribution to internal warping. The internal warping of an EUV mask leads to a curvature at the surface thereof. Normally, the internal warping of an EUV mask leads to a convex surface of the mask top side, i.e. the surface on which the multilayer structure is arranged.

A few publications which consider internal stresses of EUV masks or the effects thereof on the operating behavior of EUV masks are listed below in an exemplary manner: "Thin-absorber extreme-ultraviolet lithography mask with light-shield border for full-field scanner: flatness and image placement change through mask process" by T. Kamo et al., J. Micro/Nanolith. MEMS MOEMS, Vol. 9(2), 023005-1-023005-10 (April-June 2010); "Light-shield border impact on the printability of extreme-ultraviolet mask" by T. Kamo et al., J. Micro/Nanolith. MEMS MOEMS, Vol. 10(2) 023001-1-023001-9; "Determination of mask layer stress by placement metrology," J. Butschke et al., 25th BACUS Symposium on Photomask Technology, Vol. 5992, 59923U, CA, USA, Nov. 8, 2005, p. 1127-1138; "EUV mask image placement—a numerical study," E. Cotte et al., EMLC 2005 (European Mask and Lithography Conference) contribution, 31 Jan.-3 Feb. 2005, Dresden; "Error analysis of overlay compensation methodologies and proposed functional tolerances for EUV photomask flatness," K. Ballmann et al., Photomask Japan 2016, Proc. of SPIE, Vol. 9984, 99840S.

The German patent application DE 10 2016 204 535.0 describes a method for calibrating a measurement microscope, which uses a calibration mask and a self-calibration algorithm to ascertain error correction data of the measurement microscope, which are used for the error correction of a photolithographic mask.

In the article "Overview of IP error compensation techniques for EUVL," 26th European Mask and Lithography Conference, Proc. of SPIE, Vol. 7545, 75404-1-75404-11, P. Vukkadala et al. describe simulations relating to the warpage of EUV substrates during an EUV mask production process and relating to changes in the warpage when applying an EUV mask to an electrostatic chuck.

Currently, the placement of the pattern elements of conventional transmissive photomasks is measured by virtue of the produced photomasks being measured optically. Here, the transmissive photomasks are mounted on three hemispheres and kept in position by the gravitational effect. The bending of the newly produced masks, which is caused by their inherent weight, is ascertained with the aid of a finite element simulation and the placement errors of the pattern elements of the absorber structure caused by the bending of the transmissive mask are corrected by calculation.

The transfer of the process explained in the last paragraph for the purposes of analyzing photolithographic masks for the EUV wavelength range runs into difficulties on account of the internal warpage of these photomasks. Moreover, the requirements on the placement accuracy of pattern elements, whose actinic wavelength lies in the EUV wavelength range, are particularly high—as explained above.

The present invention therefore addresses the problem of specifying a method and apparatuses which at least partly remove the difficulties described above.

SUMMARY

According to one aspect of the present invention, this problem is solved by a method for transforming measurement data of a photolithographic mask for the extreme ultraviolet (EUV) wavelength range from first surroundings into second surroundings, in which the method includes the steps of: (a) determining the measurement data for the photolithographic mask in the first surroundings, wherein the measurement data are influenced by the effects of internal stresses on the photolithographic mask; (b) ascertaining at least one change in the measurement data during the transition from the first surroundings into the second surroundings, in which change the effects of the internal stresses on the photolithographic mask are at least partly compensated; and (c) correcting the measurement data determined in step (a) with the at least one change in the measurement data ascertained in step (b).

A method according to the invention allows the measurement of EUV masks in first surroundings and the prediction of the operating behaviour thereof in second surroundings. Here, the first surroundings and the second surroundings may differ in terms of their ambient conditions, such as, for instance, the temperature and/or ambient pressure. Further, the load on the EUV mask, for example the radiation exposure thereof, may differ in the first and second surroundings. Finally, the holding, bearing or anchoring of the EUV mask may be different in the first surroundings than in the second surroundings.

The internal stresses of the photolithographic mask for the EUV wavelength range may be produced, at least in part, by a layered construction of the photolithographic mask.

Accordingly, the internal stresses vary from one EUV mask to the next due to the manufacturing process. However, the variations of the internal stresses from specimen to specimen within a mask type are small when compared to the internal stresses of different mask types.

The internal stresses may comprise warping in a plane of the photolithographic mask which is caused, by more than 50%, by a multilayer structure of the photolithographic mask.

The internal stresses of an EUV mask change the surface flatness thereof. This leads to displacement of the pattern elements on the surface of the EUV mask. This displacement on the surface of the EUV mask is referred to as in-plane distortion (IPD). Moreover, the deviation of the mask surface from a planar area on account of the non-perpendicular light incidence on the EUV mask leads to a modified impact point of a light beam on the mask surface and, as a result thereof, leads to a laterally displaced reflected light beam. This effect is referred to as out-of-plane distortion (OPD) in the art.

Determining the measurement data may comprise determining coordinates of pattern elements on a surface of the photolithographic mask and/or determining the measurement data may comprise determining a surface contour of the photolithographic mask.

It is preferable also to measure the height information of the pattern elements, i.e. the z-coordinate, in addition to the coordinates of said pattern elements on the surface of the photolithographic mask, i.e. the xy-coordinates. Then, the one or more changes in the measurement data during the transition from the first surroundings to the second surroundings can be ascertained from the three-dimensional measurement data record.

Determining the surface contour of the photolithographic mask may be effectuated at the same time as determining the coordinates of pattern elements or the surface contour may be determined in a separate measurement. The surface contour may be determined during a time period with temperature-control for the photolithographic mask in the first surroundings.

When measuring the placement of the pattern elements on the surface of an EUV mask, it is possible to automatically also measure the contour of the surface or the surface contour. If the placement measurement does not comprise enough measurement points to determine the surface contour with a predetermined accuracy, the height profile of the EUV mask can be determined in a separate measurement, for example by way of an autofocus measurement. Since the separate determination of the height profile may be effectuated, for example, during a phase with temperature control for the EUV mask in the first surroundings, this measurement typically does not lead to an increase of the measurement time for the EUV mask in the first surroundings.

The first surroundings may comprise measurement surroundings in which the photolithographic mask is anchored by a three-point mount.

In the measurement apparatuses for determining the placement of the pattern elements of conventional transmissive photomasks, the latter are preferably held in position in a three-point mount—just like during the production of the pattern element as well. EUV masks can be used without a change in the measurement apparatus for a transmissive photomask if this anchoring concept can also be used for reflective photomasks.

The method for transforming measurement data of a photolithographic mask for the EUV wavelength range may further include the step of: determining a gravitational effect of the photolithographic mask by way of a finite element simulation and taking account of the gravitational effect when ascertaining the at least one change in the measurement data in step b.

In addition to internal stresses, the effect of gravitation also contributes to deformation of an EUV mask in the case of a three-point mount. Since both the individual contributions to the deformation of an EUV mask and the overall deformation lie within the linear deformation range of an EUV mask, the individual contributions may be determined independently of one another and taken into account independently of one another in terms of their effect.

The first surroundings may comprise measurement surroundings in which the photolithographic mask is anchored by a chuck.

The second surroundings may comprise an EUV lithography apparatus in which the photolithographic mask is anchored by a chuck. The chuck may comprise an electrostatic chuck or a vacuum chuck.

As a rule, EUV lithography apparatuses—like lithography apparatuses in general—are equipped with a holder for the photomasks in the form of a chuck. As a result of the different holders of EUV masks when measuring the pattern elements and during the operation of the EUV mask, one or more changes occur in the measurement data, said measurement data having been measured in the first surroundings, during the transition into the second surroundings, on account of internal stresses in EUV masks and the different effects of gravitation in the various mask holders. The above-described method defines a transformation process for transferring data measured in the first surroundings into second surroundings.

Anchoring the photolithographic mask can substantially produce a planar area of a rear-side surface of the photolithographic mask.

A planar area of a rear-side surface or of a rear side of an EUV mask is referred to as reference plane below. The measurement data determined in first surroundings are transformed onto the reference plane of a planar rear-side surface of an EUV mask. A rear-side surface or a rear side of an EUV mask is the surface that lies opposite the surface on which the pattern elements of the EUV mask are arranged.

The definition, provided above, of a reference plane is equivalent to a planar surface of a chuck if the assumption is made that the chuck is able to exert a force onto the EUV mask such that the rear side thereof rests substantially with the whole area thereof on the surface of the chuck. As already explained above, EUV masks are typically operated while held by a chuck during the operation of said EUV masks in an exposure system of an EUV lithography apparatus.

Within this application, the expression "substantially" describes the measurement variable within the error specification if measurement appliances according to the prior art are used.

Determining the measurement data for the photolithographic mask in the first surroundings comprises: irradiating the photolithographic mask with a photon beam and/or an electron beam. The photon beam may have a wavelength in the region of 193 nm and a numerical aperture of between 0.5 and 0.9, preferably 0.8, and/or the photon beam may comprise a wavelength in the range from 10 nm to 15 nm and may have a line width<1 nm, and/or the electrons of the electron beam may have kinetic energy in the range from 0.1 keV to 100 keV, preferably 0.2 keV to 80 keV, more preferably 0.3 to 50 keV and most preferably 0.5 keV to 30 keV.

For the purposes of analyzing the placement of pattern elements of photolithographic masks for the EUV wavelength range, it is advantageous to use photons with the shortest possible wavelength because the resolution of a measurement apparatus for determining the placement of the pattern elements increases with decreasing wavelength. However, the lack of availability of EUV light sources currently still largely prevents the use of measurement apparatuses that operate at the actinic wavelength. Alternatively, or additionally, it is possible to use electron beams for examining the placement of pattern elements on the front-side surface of EUV masks. Electron beams offer the advantage of a large lateral resolution; however, the spatial resolution of the beam direction is limited. Moreover, scanning the entire surface of an EUV mask requires a long time interval.

Ascertaining the at least one change in the measurement data may comprise: ascertaining a change in spatial orientation of a neutral fiber of the photolithographic mask during the transition from the first surroundings to the second surroundings. The change in spatial orientation of the neutral fiber can be ascertained on the basis of the measurement data determined in step a.

A neutral fiber denotes a body, for example a beam or a plate, a plane, in which a compressive stress transitions into a tensile stress. The neutral fiber is force free. The neutral plane of a photomask can be described at each point of the mask by slopes or local tangents in the x- and y-direction.

The change in spatial orientation of the neutral fiber can be ascertained indirectly on the basis of the measurement data determined in step (a).

Firstly, a change in the internal stresses of an EUV mask leads to a change in the positions of the pattern elements on a surface of the EUV mask. Secondly, a change in the stress state of an EUV mask is expressed in a change in the surface state and consequently also in the spatial orientation of the neutral fiber of an EUV mask. Therefore, a change in spatial orientation of the neutral fiber can be deduced from a change in the surface, said change in the spatial orientation of the neutral fiber being able to be used for ascertaining a change in the measurement data during the transition from the first to the second surroundings.

Ascertaining the change in spatial orientation of the neutral fiber may comprise ascertaining a change in a magnification of the photolithographic mask in the first surroundings with respect to the second surroundings. Ascertaining the change in a magnification may comprise determining an isotropic magnification factor and/or may comprise determining at least two magnification factors which capture an anisotropic magnification of the photolithographic mask in the first surroundings.

The surface of an EUV mask on which the pattern elements are placed is referred to as front side or mask front side below. The internal stresses of an EUV mask result in curvature of the front-side surface, on which the pattern elements are arranged. As a result, the surface of the EUV mask is stretched, with the pattern elements being displaced in the process. Symmetric curvature of the EUV mask perpendicular to the mask plane brings about a symmetric displacement of the pattern elements and therefore behaves like a magnification.

Ascertaining the change in spatial orientation of the neutral fiber may comprise: reading the change in spatial orientation of the neutral fiber from a database which comprises the spatial orientation of the neutral fibers of different mask types.

As already explained above, individual EUV masks have individual internal stress states. The individual changes in stress within a specific mask type may be neglected to a first approximation when compared to the internal stresses of different mask types. Different mask types have characteristic internal stress states, and so a characteristic stress state can be determined for the respective mask type and stored in a memory. For the purposes of determining the characteristic stress state of an EUV mask, it is possible to measure the stress states of a plurality of masks, the measurement data of which are subsequently subjected to an averaging process.

Ascertaining the change in spatial orientation of the neutral fiber may comprise: carrying out a finite element simulation of the photolithographic mask in the first surroundings for determining the change in spatial orientation of the neutral fiber.

To a first approximation, knowledge about the dimensions and the material properties of the mask substrate suffice for carrying out a finite element simulation for a conventional transmissive photomask. The data of the rear-side metallization layer and the data of the pattern elements on the mask front side must be known for a more precise analysis by use of a finite element simulation.

For the purposes of carrying out a finite element simulation of a reflective EUV mask, knowledge of the layer thicknesses and the material composition of the multiplicity of layers of the multilayer structure is also required in any case in addition to the geometry and material data of the mask substrate. Optionally, the density of the etched pattern elements and the spatial orientation of the light shielding edges, which are referred to as "black borders" in the art, are also required for precisely determining the stress state of an EUV mask. Therefore, ascertaining all necessary input parameters for a finite element simulation of an EUV mask may be a complicated process.

If a finite element simulation is carried out for determining the change in spatial orientation of the neutral fiber, it is advantageous to take account of the effect of gravity on account of the mount of the EUV mask.

Ascertaining the at least one change in the measurement data may comprise: determining a change in the magnification of the photolithographic mask in the first surroundings in respect of a predetermined magnification.

The curvature of the mask surface results in a change in the magnification or reduction in relation to imaging of an EUV mask as provided by the design. From the determined change in the imaging of the EUV mask in the first surroundings, it is possible to deduce the degree of curvature and hence the change in the neutral fiber of the EUV mask.

The change in the magnification may comprise a rotationally symmetric magnification about an axis perpendicular to the mask plane or an asymmetric magnification in two orthogonal directions in the mask plane. In the art, a rotationally symmetric magnification is known as a "magnification" or "magnification correction" and an asymmetric magnification is known as a "scale" or "scale correction."

Ascertaining the at least one change may comprise: determining a change in the magnification of the photolithographic mask by a magnification compensation of a measurement apparatus for determining the change in spatial orientation of the neutral fiber of the photolithographic mask in the first surroundings.

A magnification compensation may comprise a computational compensation of the change in magnification of the photolithographic mask. Further, the computational compensation of the change in magnification may be effectuated with the aid of the coordinates of the pattern elements in the mask surface.

The measurement data may be determined after producing pattern elements on a mask surface and/or may be effectuated after producing at least one black border in the active region of the photolithographic mask.

After the pattern elements were etched, the positions thereof can be measured for the first time. The subsequent production of black borders at the boundaries of the exposure areas or exposure fields, for example by etching trenches through the multilayer structure, changes the internal stresses of the EUV mask and hence the positions of the pattern elements on the mask surface. Therefore, the placement data are preferably measured after the last processing step of the production process of the EUV mask which changes the inner stresses of the EUV mask. However, it is also possible to determine the placement of the pattern elements on the EUV mask immediately after the completion of the production process and to add the change in the placement of the subsequent process steps, which change the internal stresses of the EUV mask, by calculation to the one or more changes in the measurement data.

Ascertaining the at least one change in the measurement data may comprise a change in the measurement data during a subsequent process step in the mask production.

The effects of the process steps which follow the etching of the pattern elements on the internal stresses of an EUV mask may be ascertained experimentally for various pattern configurations and different mask types and may be stored in a database such that it is possible to resort to these data when necessary.

Ascertaining the at least one change in the measurement data may comprise: determining a height difference of a photolithographic mask. Determining a height difference of a photolithographic mask may comprise: determining a maximum height difference from a three-dimensional data record of an EUV mask and/or determining a maximum height difference from a second-order fit to a height profile of the EUV mask.

If electromagnetic radiation is incident on an EUV mask at an angle that deviates from the perpendicular to the mask plane, a curved surface of an EUV mask leads to a beam offset of the reflected radiation in relation to an EUV mask with a plane surface. Determining a global height difference of a height profile of a curved EUV mask facilitates ascertaining a beam offset of EUV radiation that is incident on an EUV mask. As a result, it becomes possible to take account of the beam offset when ascertaining the change(s) in the measurement data during the transition from the first to the second surroundings.

A computer program may contain instructions which, when executed by a computer system, prompt the computer system to carry out the steps of the methods specified above and/or of the aspects specified above.

In another aspect, an evaluation unit for an apparatus for measuring a placement of pattern elements of a photolithographic mask for the extreme ultraviolet (EUV) wavelength range is embodied to carry out the steps of the above-defined method and/or of the aspects specified above.

DESCRIPTION OF DRAWINGS

The following detailed description describes currently preferred exemplary embodiments of the invention, with reference being made to the drawings, in which:

FIG. 3 presents, in the upper image, a schematic section through a real EUV mask anchored by use of a three-point mount and shows, in the lower partial image, the EUV mask of the upper partial image which is mounted on a chuck;

DETAILED DESCRIPTION

Below, currently preferred embodiment of a method according to the invention and of an apparatus according to the invention are explained on the basis of a photolithographic mask for the extreme ultraviolet (EUV) wavelength range, the pattern elements of said photolithographic mask comprising absorbing material. However, a method according to the invention for transforming measurement data of an EUV mask is not restricted to the examples discussed below. Rather, said method can be used in the same way for transforming measurement data of different types of EUV masks, in particular, for example, for transforming the measurement data of phase-shifting EUV masks. Moreover, a method according to the invention can be used in general for transforming measurement data of an EUV mask from first surroundings to any reference surface.

Figure 1:
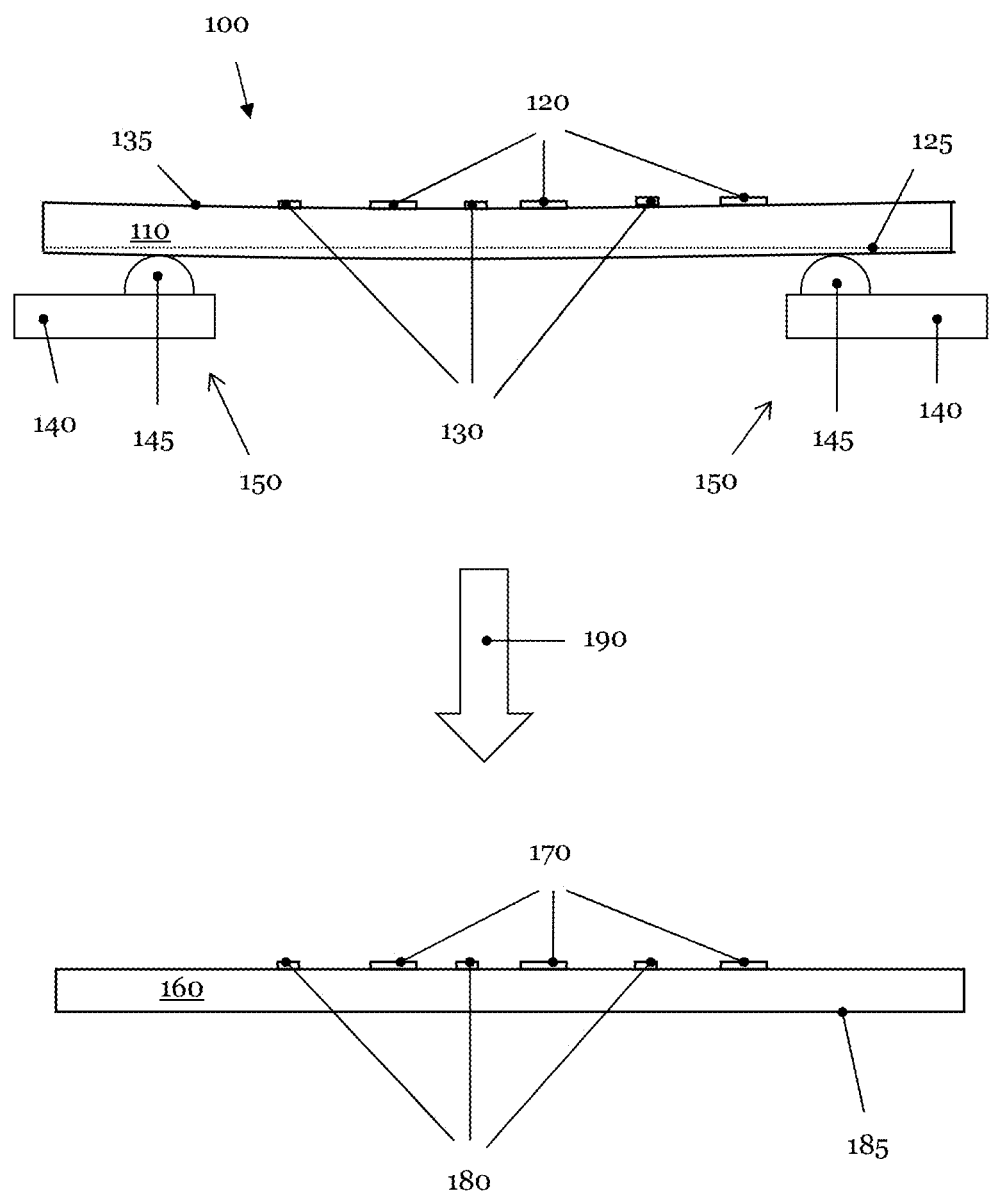
FIG. 1 shows, in the upper partial image, a schematic section through a conventional transmissive photolithographic mask according to the prior art that is mounted on three hemispheres and presents, in the lower partial image, the photolithographic mask of the upper partial image, the bending of which on account of the effect of gravity was corrected.

In the upper partial image, FIG. 1 shows a schematic section through a conventional transmissive photomask 100 according to the prior art. The photomask 100 has a transmissive substrate 110, for example made of quartz, and absorbing pattern elements 120 and 130. Typically, the substrate 110 of a transmissive photomask 100 has a thickness of 6.35 mm. Conventional photomasks 100 often have lateral dimensions (i.e., dimensions in the mask plane) of 152 mm×152 mm. Preferably, an area of 142 mm×142 mm is used for imaging the pattern elements 120, 130 onto a wafer (active area of the photomask 100). Pattern elements 120 and 130 are arranged within this region. The absorbing pattern elements 120, 130 are attached to the mask front side 135 of the photomask 100.

Photomasks 100 are often mounted in punctiform fashion on three spheres or hemispheres during the production of the pattern elements 120, 130 and during the measurement of the positions of the produced pattern elements 120, 130. The upper partial image of FIG. 1 reproduces a section through two of the three hemispheres or resting spheres 145. The three hemispheres or resting spheres 145 are part of a three-point mount 140 which anchors the photomask 100. The three-point mount 140 in turn is a part of first surroundings 150 in which the pattern elements 120, 130 are produced and the positions thereof are measured. As indicated by the dotted line 125 and as a result of the effect of gravity, the photomask 100 bends during the production and the measurement of the pattern elements 120, 130 on account of its mass. The bending of the photomask 100 slightly changes the positions of the pattern elements 120, 130 in comparison with a mask which has no bending or curvature. The lower partial image of FIG. 1 presents the photomask 100 of the upper partial image, the substrate 160 of which is plane. The pattern elements 170, 180 of the lower photomask 100 with the plane substrate 160 have, in relation to the photomask 100 illustrated in the upper partial image of FIG. 1, a slight displacement in relation to the measured pattern elements 120, 130.

The perpendicular arrow in FIG. 1 represents a finite element simulation 190 of the substrate 110 of the photomask 100. The finite element simulation 190 of the substrate 110 of the photomask 100 is carried out to determine the effect of gravity on the substrate 110 of the photomask 100 in the three-point mount 140 of the photomask 100 illustrated in the upper partial image of FIG. 1. At the same time, the finite element simulation 190 is used to ascertain the positions of the pattern elements 170, 180 on the plane mask front side 185 on the basis of the measured pattern elements 120, 130. When carrying out the finite element simulation 190, the conventional photomask 100 can be replaced, to a good approximation, by the substrate 110 thereof.

Figure 2:
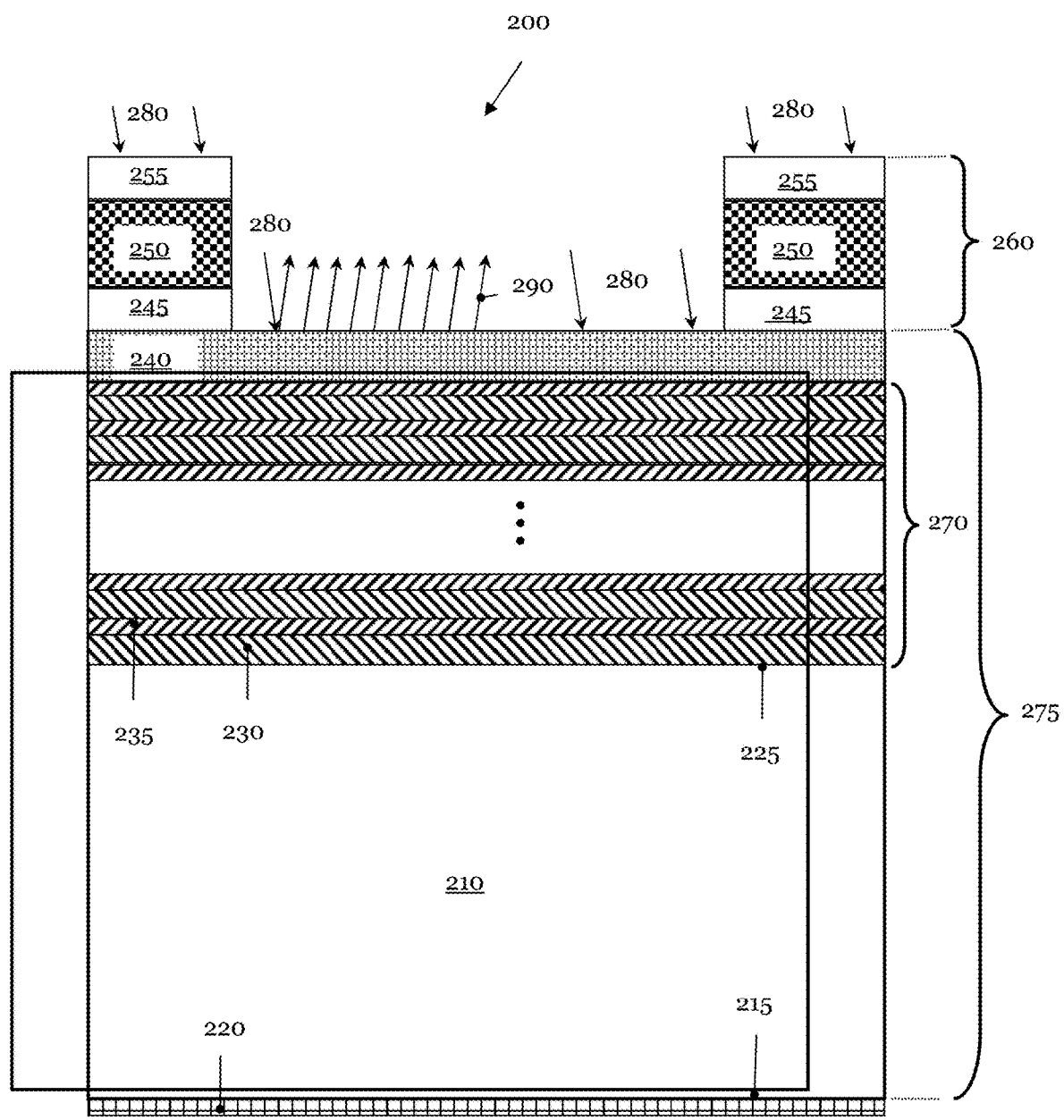
FIG. 2 schematically elucidates a cross section through an ideal photomask for the extreme ultraviolet (EUV) wavelength range.

FIG. 2 schematically presents a section through an ideal absorbing photolithographic mask 200 for the EUV wavelength range. A photolithographic mask for the EUV wavelength range is also referred to below as EUV mask or EUV photomask. The exemplary ideal EUV mask 200 is designed for an exposure wavelength in the region of 13.5 nm. The EUV mask 200 has a substrate 210 made of a material with a low coefficient of thermal expansion, such as quartz, for example. Other dielectrics, glass materials or semiconducting materials likewise can be used as substrates for EUV masks, such as ZERODUR®, ULE® or CLEARCERAM®, for instance. The rear side 215 or the rear-side surface 215 of the substrate 210 of the EUV mask 200 serves to hold the substrate 210 during the production of the EUV mask 200 and during the operation thereof in an EUV photolithography apparatus. Preferably, a thin electrically conductive layer 220 for holding the substrate 210 on an electrostatic chuck (ESC) is applied to the rear side 215 of the substrate 210. The chuck is not illustrated in FIG. 2. In an alternative embodiment, the EUV mask 200 has no electrically conductive layer 220 on the rear side 215 of the mask substrate 210 and the EUV mask is anchored with the aid of the vacuum chuck (VC) during its operation in an EUV photolithography apparatus.

A multilayer film or a multilayer structure 270 comprising 20 to 80 pairs of alternating molybdenum (Mo) 230 and silicon (Si) layers 235, which are also denoted MoSi layers below, is deposited onto the front side 225 of the substrate 210. In order to protect the multilayer structure 270, a capping layer 240 made of silicon dioxide, for example, is applied on the topmost silicon layer 235. Other materials such as ruthenium (Ru), for example, can likewise be used for forming a capping layer 240. Instead of molybdenum, it is also possible to use layers composed of other elements having a high mass number, such as e.g. cobalt (Co), nickel (Ni), tungsten (W), rhenium (Re), zirconium (Zn) or iridium (Ir), for the MoSi layers. The deposition of the multilayer structure 270 can be effectuated by ion beam deposition (IBD), for example.

The substrate 210, the multilayer structure 270 and the capping layer 240 are also referred to as a mask blank 275 below. However, a structure having all the layers of an EUV mask, but without structuring of the whole-area absorber layer 260, may also be referred to as a mask blank 275.

In order to produce an EUV mask 200 from the mask blank 275, a buffer layer 245 is deposited on the capping layer 240. Possible buffer layer materials are quartz ($SiO_2$), silicon oxygen nitride (SiON), Ru, chromium (Cr) and/or chromium nitride (CrN). An absorption layer 250 is deposited on the buffer layer 245. Materials suitable for the absorption layer 250 are, inter alia, Cr, titanium nitride (TiN) and/or tantalum nitride (TaN). An antireflection layer 255, for example made of tantalum oxynitride (TaON), can be applied on the absorption layer 250.

The absorption layer 250 is structured, with the aid of an electron beam or a laser beam, for example, such that a structure of absorbing pattern elements 250 is produced from the whole-area absorption layer 260. The buffer layer 245 serves to protect the multilayer structure 270 when structuring the absorber layer 260, i.e. when producing the pattern elements 250.

The EUV photons 280 are incident on the EUV mask 200. The incident EUV photons 280 are absorbed in the regions of the pattern elements 250 and at least the plurality of the EUV photons 280 are reflected by the multilayer structure 270 in the regions which are free from absorbing pattern elements 250.

The multilayer structure 270 should be designed in such a way that the layer thicknesses of e.g. a molybdenum layer 230 and a silicon layer 235 correspond to an optical thickness of $\lambda/2$ of the actinic wavelength for the EUV photons 280 that are incident on the multilayer structure 270 at the predetermined angle of incidence. A deviation from this condition leads to a local violation of Bragg's reflection condition and hence to a change of the locally reflected light in the EUV wavelength range. On account of the very small wavelengths, the EUV range places extreme requirements on the homogeneity of the individual layers of the multilayer structure 270 and on the placement of the pattern elements 250 on the multilayer structure 270.

FIG. 2 represents an ideal EUV mask 200. The EUV mask 300 in the upper partial image of FIG. 3 schematically shows a section through an EUV mask 300. The EUV mask 300 is mounted on two hemispheres 145 of a three-point mount 140. Once again, the three-point mount 140 is part of first surroundings 150. In addition to the three-point mount 140, the first surroundings 150 have defined ambient conditions, for example a predetermined temperature and a predetermined humidity. Additionally, changes in the ambient conditions, such as, for example, the air pressure or the gas composition, and possible influences resulting therefrom may be compensated.

Unlike the ideal EUV mask 200 in FIG. 2, the EUV mask 300 in the first surroundings 150 of FIG. 3 has a curvature. The curvature or bending of the substrate front side 325, on which the multilayer structure 370 and the pattern elements 360 are applied, has a convex form in the example illustrated in FIG. 3. The internal stresses arise in the EUV mask 300, in particular in the substrate 310 thereof, as a result of the deposition of the multilayer structure 370 on the substrate 310 at a temperature of approximately 200° C. The different coefficient of thermal expansion of the materials of the multilayer structure 370 and of the substrate 310 lead to the buildup of internal stresses in the combination of substrate 310 and multilayer structure 370 during the cooling process of this material combination. In the three-point mount, there is a combination of the curvature caused by the internal stresses of the EUV mask and the deformation caused by the inherent weight of the mask in the three-point mount.

Depositing the absorber layer 260, structuring the pattern elements 370 and producing black borders at the boundaries of the individual exposure fields of the EUV mask 300 likewise contribute, in the EUV photomasks 300, to internal stresses or the changes therein during the mask production process. Further, a thin, whole-area electrically conductive rear-side layer 220 makes a contribution to the internal stresses of the photolithographic mask 300. The conductive rear-side layer 220 in FIG. 2 has been suppressed in FIG. 3 for reasons of clarity. Typically, the largest contribution to the internal stresses of an EUV mask 300 comes from a multiplicity of MoSi layers 230, 235 of the multilayer structure 370. The inner stresses of absorbing EUV masks typically lie in a range of 100 MPa to 5 GPa, in particular in the range from 300 MPa to 500 MPa.

The positions of the pattern elements 360 are measured in the first surroundings 150 of the upper partial image of FIG. 3. In the exemplary first surroundings 150 depicted in the upper partial image of FIG. 3, gravity or gravitation counteracts the curvature of the EUV mask 300 on account of the three-point mount 140 of the curved EUV mask 300. Now, the measurement data, for example the placement data of the pattern elements 360, determined in the first surroundings 150 and/or the ambient conditions mentioned above should be transformed into second surroundings. In the second surroundings 350, the EUV mask 300 has a substantially plane rear-side surface 325 as a reference plane. The placement data of the pattern elements 365 in the second surroundings 350 are related to this reference plane 325. A planar rear side 325 of a substrate 320 of the EUV mask 300 can be achieved or forced by, for example, mounting it on a chuck 330. The chuck 330 may comprise an electrostatic chuck (ESC) or a vacuum chuck (VC). In an alternative embodiment, an arbitrarily formed reference area may be selected for the EUV mask 300 in the second surroundings 350, so long as the predetermined reference area produces a deformation of the EUV mask which comes as close as possible to the reference area of the second surroundings.

The perpendicular arrow in FIG. 3 represents the changes 390 which have to be undertaken on the measurement data recorded in the first surroundings 150 in order to transform said measurement data from the first surroundings 150 to the second surroundings 350.

In a first exemplary embodiment, a finite element simulation of the EUV mask 300 is carried out in the first surroundings 150 in order to ascertain the change 390 in the placement data of the pattern elements 360 during the transition from the first surroundings 150 to the second surroundings 350. Both the curvature and the effect of gravity on the EUV mask 300 is taken into account during the finite element simulation of the EUV mask 300.

Unlike what was explained in the context of FIG. 1, replacing the EUV mask 300 in the finite element simulation with the substrate 310 thereof does not suffice for the EUV mask 300. This approximation would neglect the internal stresses of the EUV mask 300, the effects of which exceed the effect of gravity many times over. However, it is difficult, and hence requires much time, to ascertain all input parameters for the EUV mask 300 in order to carry out a reliable finite element simulation. These difficulties are mainly due to the multiplicity of layers in the multilayer structure 370. Therefore, alternative exemplary embodiments for ascertaining the change(s) 390 in the measurement data during the transition from the first surroundings 150 to the second surroundings 350 are described below, said alternative exemplary embodiments being less complicated than the performance of a finite element simulation for the EUV mask 300.

In the alternative exemplary embodiments described below, the effect of gravity on the EUV mask 300 in the first surroundings 150 in terms of the change(s) 390 in the measurement data is taken into account by a finite element simulation of the substrate 310 of the EUV mask 300—similar to what was explained in the context of FIG. 1.

Figure 4:
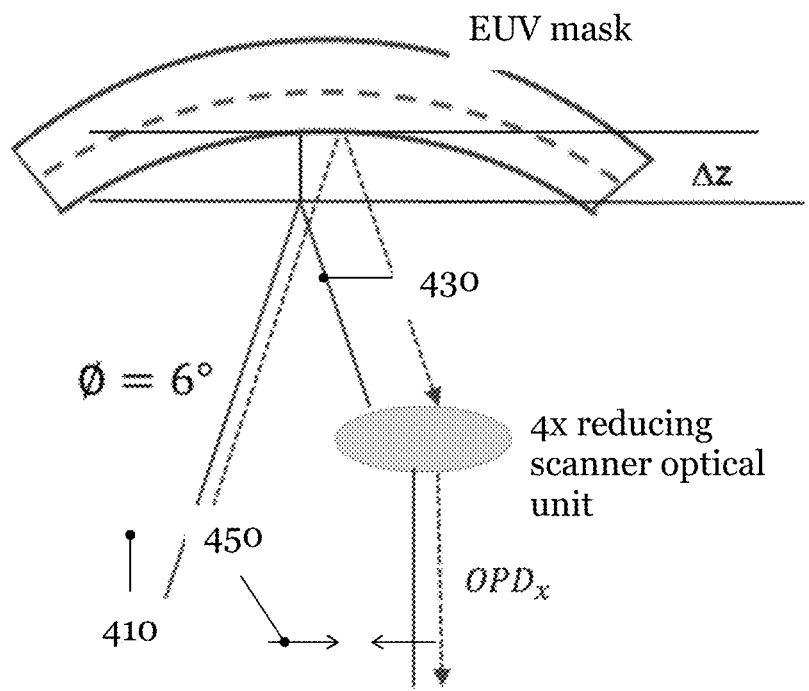
FIG. 4 schematically elucidates the out-of-plane distortion (OPD) of the curved EUV mask in the upper partial image of FIG. 3.

FIG. 4 schematically explains a first effect of a curved mask surface 315, 335 which results in a beam offset of reflected EUV radiation 450. The beam offset brings about a shift of the measured pattern elements 360 to positions that are different when compared with the pattern elements 365 of a substrate 320 of an EUV mask that is not curved. The beam offset is the result of a non-perpendicular light incidence on the EUV mask. The beam offset in the x-direction, i.e., in one direction in the mask plane, as a result of the global curvature of the EUV mask is referred to as the out-of-plane distortion (OPD) in the art. The OPD is captured by the following formula:

$$OPD_x = \Delta z \cdot \tan \Phi \cdot M \quad (1)$$

Typically, the EUV light 410 in an EUV scanner is incident on the surface of an EUV mask at an angle of 5° to 9°. In the example illustrated in FIG. 4, an angle of Φ=6° was selected. The EUV mask in FIG. 4 has a height difference Δz over the area of the EUV mask on account of its curvature. Often, the optical unit of the scanner, i.e. the second surroundings 350, has a magnification in a range from ¼ to ⅛. In the example of FIG. 4, a reduction by a factor of 4 is specified.

Figure 5:
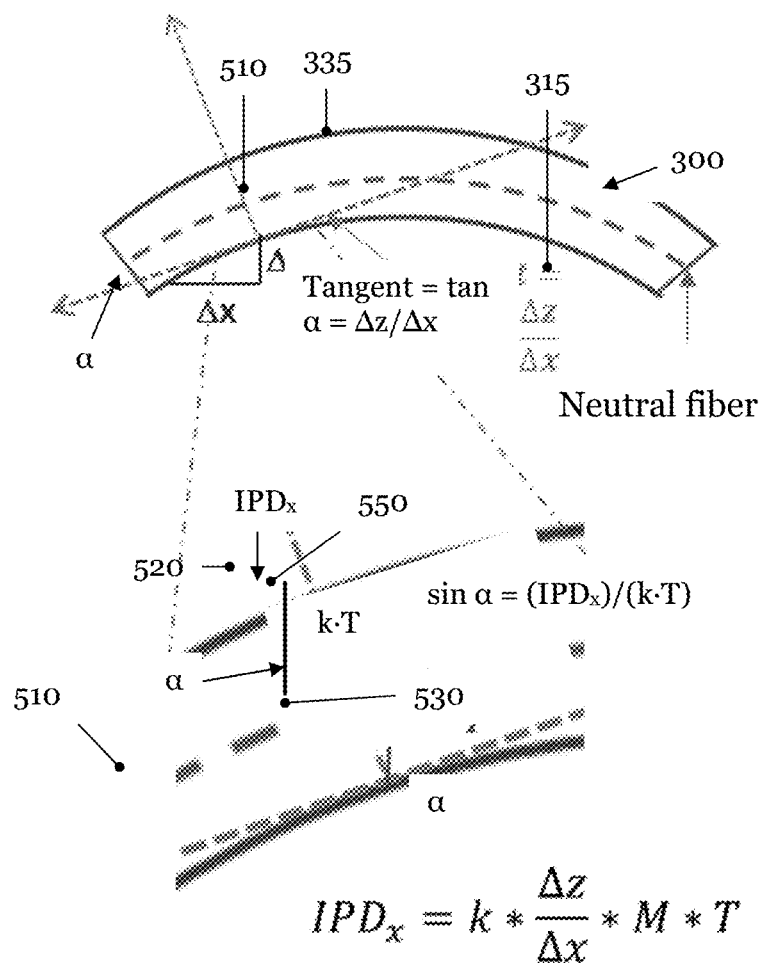
FIG. 5 schematically defines the in-plane distortion (IPD) of the curved EUV mask in the upper partial image of FIG. 3.

A second effect of a locally curved mask surface on the measured placement of the pattern elements 360 is explained schematically on the basis of FIG. 5. The upper partial image of FIG. 5 schematically presents the curved EUV mask from FIG. 4. The local curvature of the surface of an EUV mask is described by the tangent Δz/Δx. The tangent may likewise be expressed by the angle α according to the equation tan α=Δz/Δx.

The dashed line in the curved EUV mask elucidates the neutral fiber 510 in both partial images of FIG. 5. The neutral fiber 510 describes the area in which a compressive stress (in the upper region of the EUV mask in FIG. 5) transitions to a tensile stress (in the lower region of the EUV mask in FIG. 5). The EUV mask does not have internal warping in the two-dimensional plane of the neutral fiber 510.

The lower partial image of FIG. 5 shows a magnified section of the curved EUV mask of the upper partial image of FIG. 5. The relationship between a change in spatial orientation of the neutral fiber 510 and the displacement of a pattern element 360 on the surface 335, caused by a curvature of the EUV mask 300, is explained on the basis of this partial image. The dashed cut line 520 through the EUV mask cuts the neutral fiber 510 in perpendicular fashion and therefore substantially also cuts the front-side surface 335 and the rear-side surface 315 at right angles. The perpendicular of the point of intersection 530 of the neutral fiber 510 to the front-side surface 335 of the EUV mask has a length k·T. Here, T describes the thickness of an EUV mask. The substrate of an EUV mask typically has—as explained above—a thickness of 6.35 mm. The parameter k defines a spatial orientation of the neutral fiber 510 as a fraction of the mask thickness T. For an EUV mask without internal warpage, k has a value of 0.5. For a warped EUV mask 300, the parameter k according to the definition specified in the lower partial image of FIG. 5 typically lies in an interval of ½<k<⅔.

The displacement of the pattern elements 360 on the front-side surface 335 of the EUV mask 300 or the IPD in the x-direction is determined by the distance between the points of intersection of the cut line 520 and the perpendicular k·T to the point of intersection 530 with the surface 335. Hence, the distance 550 determines one of the changes 390 in the measurement data of the pattern elements 360 on account of the curvature of the EUV mask 300. For small angles, the following applies to a good approximation: sin α≈tan α. Therefore, the displacement 550 of the pattern elements 360 arises from:

$$IPD_x = k \cdot T \cdot \sin\alpha \approx k \cdot T \cdot \tan\alpha = k \cdot T \cdot \frac{\Delta z}{\Delta x}.$$

If the magnification factor M of the projection lens or of the projection mirror of an EUV photolithography apparatus is taken into account in the equation for the IPD, the last-specified equation is extended to:

$$IPD_x = k \cdot T \cdot \frac{\Delta z}{\Delta x} \cdot M \quad (2)$$

The change 390, 550 in the measurement data on account of a curvature of the EUV mask 300 in relation to an EUV mask with a planar substrate 320 is proportional to the local curvature $$\frac{\Delta z}{\Delta x},$$

the thickness of the EUV mask T and the change in spatial orientation of the neutral fiber 510 described by the parameter k, and scales with the magnification or reduction of the projection mirror of the EUV photolithography apparatus.

Figure 6:
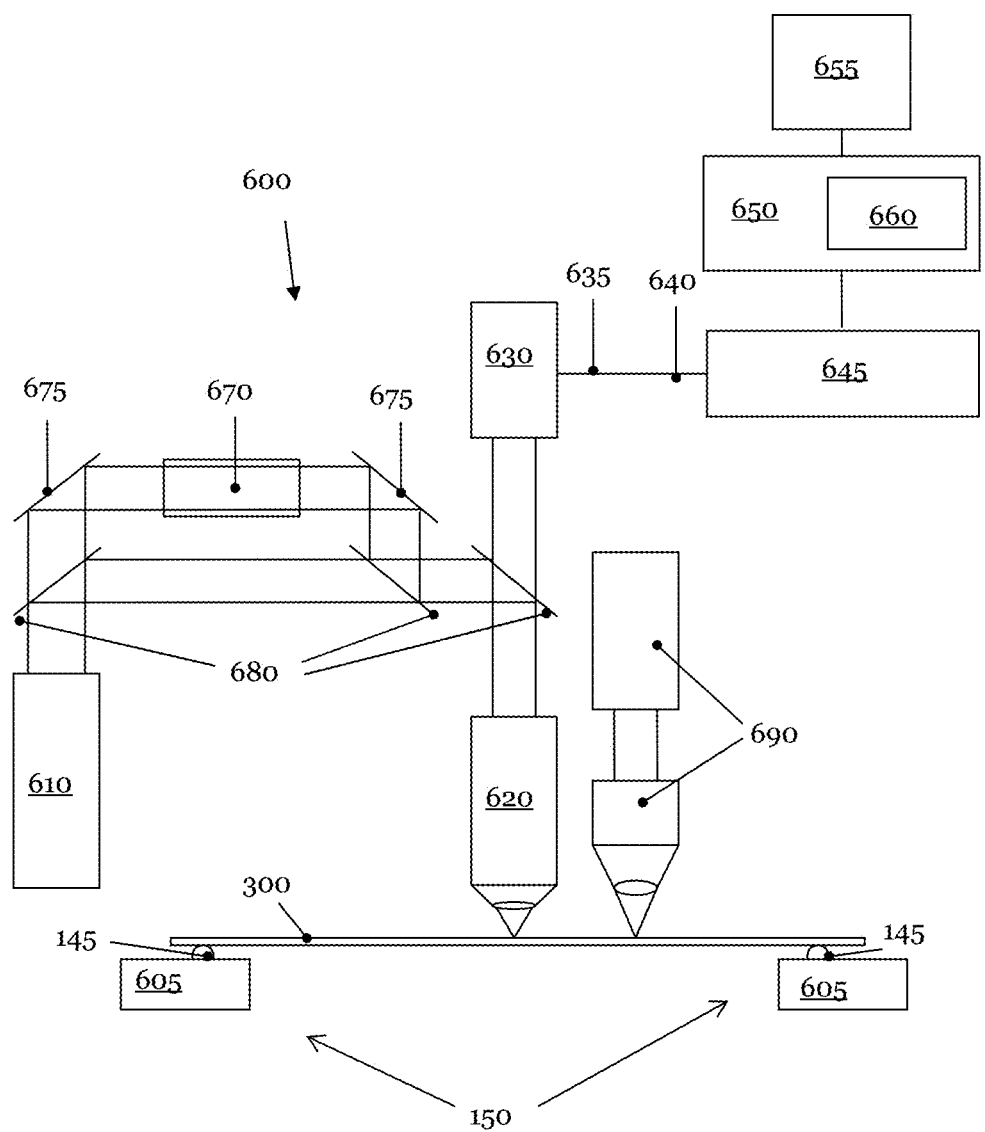
FIG. 6 presents a schematic section through a measurement apparatus for determining the placement of pattern elements of an EUV mask.

FIG. 6 shows a section through a functional sketch of a measurement apparatus 600, by use of which the positions of the pattern elements 360 on the EUV mask 300 in the first surroundings 150 can be measured. The photolithographic mask 300 is mounted on three hemispheres 145 on a highly precise stage 605 in the first surroundings 150. The bending or curvature of the EUV mask 300 is suppressed in FIG. 6 for reasons of clarity. The stage 605 is movable in three translation directions and three rotational directions. Further, the movement of the stage 605 in all six degrees of freedom is actively monitored and regulated. In the measurement apparatus 600 in FIG. 6, the stage 605 is the only movable component.

The measurement apparatus 600 uses an excimer laser as a light source 610, said laser emitting light in the deep ultraviolet (DUV) wavelength range at approximately 193 nm. The imaging lens 320 has, as a standard, a numerical aperture (NA) which typically lies between 0.5 and 0.9. The NA of the lens can be expanded in order to increase the resolution of the measurement apparatus 600.

A CCD (charge-coupled device) camera 630 is used as a detector, said detector measuring light that is reflected by the EUV mask 300. The CCD camera 630 transmits its measurement data 640 via the connection 635 to the signal processing unit 645, which produces an image from the measurement data 640 of the CCD camera 630.

As discussed in the context of FIGS. 1 and 3, conventional photomasks 100, and, in particular, EUV masks 300, may have curvature. Therefore, the measurement apparatus 600 has an autofocus (AF) system 670, which is based on an inclined lattice and which is not shown in FIG. 6. The AF system 670 assists the process of recording measurement data of the EUV mask 300. In particular, the AF system 670 may be used to produce a height profile of the EUV mask 300. With the aid of the AF system 670, the measurement apparatus 600 can measure the height profile of the EUV mask 300 while recording the positions of the pattern elements 360. Should these measurement data be insufficient, the measurement apparatus 600 may ascertain the height profile of the EUV mask 300 by use of the AF system 670 in a separate measurement. This measurement may be carried out by the measurement apparatus 600 during an interval with temperature control for the EUV mask 300 in the first surroundings 150 (soaking time), and so measuring the height profile of the EUV mask 300 does not reduce the throughput or the mask throughput of the measurement apparatus 600.

The mirrors 675 and the partly transmissive mirrors 680 direct the laser beam onto the lens 620.

The measurement apparatus 600 further comprises an optical auxiliary system 690 for approximately aligning the pattern elements 360 of the EUV mask 300. Further, the measurement apparatus 600 may comprise further auxiliary systems (not illustrated in FIG. 6), which measure the ambient conditions that are prevalent in the vicinity of the EUV mask 300.

A computer system 650 can display on a monitor 655 of the computer system 650 the image calculated by the signal processing unit 645. The computer system 650 may control the light source 610, the movements of the stage 605, the lens 620 and/or the AF system 670. Further, the computer system 650 comprises an evaluation unit 660. The evaluation unit 660 contains algorithms which are embodied in the form of hardware, software, firmware or a combination thereof. The algorithms of the evaluation unit 660 may determine one or more changes 390, 550 for the measurement data 640 in order to transform the measurement data 640 of the EUV mask 300 from the first surroundings 150 to second surroundings 350.

Further, the computer system 650 may comprise one or more non-volatile data memories (not shown in FIG. 6). The algorithm or algorithms, measurement data 640, the change(s) 390, 550 for the measurement data 640 and the corrected measurement data may be stored in the data memory.

In the example illustrated in FIG. 6, the evaluation unit 660 is part of the computer system 650. In an alternative embodiment, the evaluation unit 660 may be embodied as an independent unit which can interchange data or measurement data with the data processing unit 645 and/or the computer system 650 via a data connection.

Figure 7:
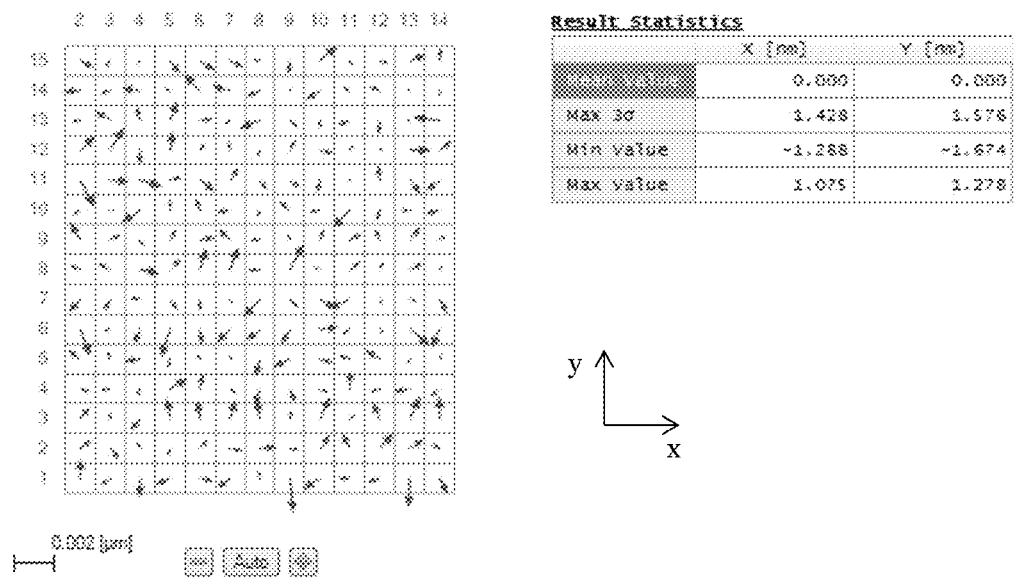
FIG. 7 reproduces an example of the two-dimensional measurement data determined by the measurement apparatus in FIG. 6.

In the left-hand partial image, FIG. 7 shows, represented by the arrows, the displacements of the pattern elements 360 of the EUV mask 300 in the first surroundings 150, as measured by the measurement apparatus 600, in relation to the design data. The direction of an arrow specifies the direction of the displacement of a pattern element 360 in the mask plane and the length of an arrow represents a size of the deviation of the measured placement from the predetermined design data.

The right-hand partial image of FIG. 7 shows the slightly asymmetric displacement of the measured pattern elements 360 of the EUV mask 300 in the x- and y-directions. In addition to the mean values for the x- and y-direction, the table in the right-hand partial image of FIG. 7 specifies the deviation of the mean values, represented by the 3σ value, and the minimum and maximum displacements of the pattern elements 360 for the x- and y-directions.

In a second embodiment for ascertaining the change(s) 390, 550 in the measurement data 640 during the transition from the first surroundings 150 to second surroundings 350, the assumption is now made that the substrate 310 of the EUV mask 300 had substantially no internal stresses in its initial state. The systematic displacement of the pattern elements 360 of the EUV mask 300, illustrated in FIG. 7, is then considered as substantially caused by the mask production process. As already explained above, an internal stress in the EUV mask 300 causes curvature of the mask 300, which leads to a change in the size of the image of the EUV mask 300. The change in the image of the EUV mask 300 can be used to determine the change in spatial orientation k of the neutral fiber 510, according to equation (2), as a result of the curvature of the EUV mask 300. Since the measurement apparatus 600, or the evaluation unit 660 thereof, is likewise able to determine the local slope $$\frac{\Delta z}{\Delta x}$$

from the measured data, it is possible, at least approximately, to calculate the change(s) 390, 550 in the measurement data 640 during the transition from the first surroundings 150 to the second surroundings 350 from the analysis of the two-dimensional measurement data of the measurement apparatus 600.

Figure 8:
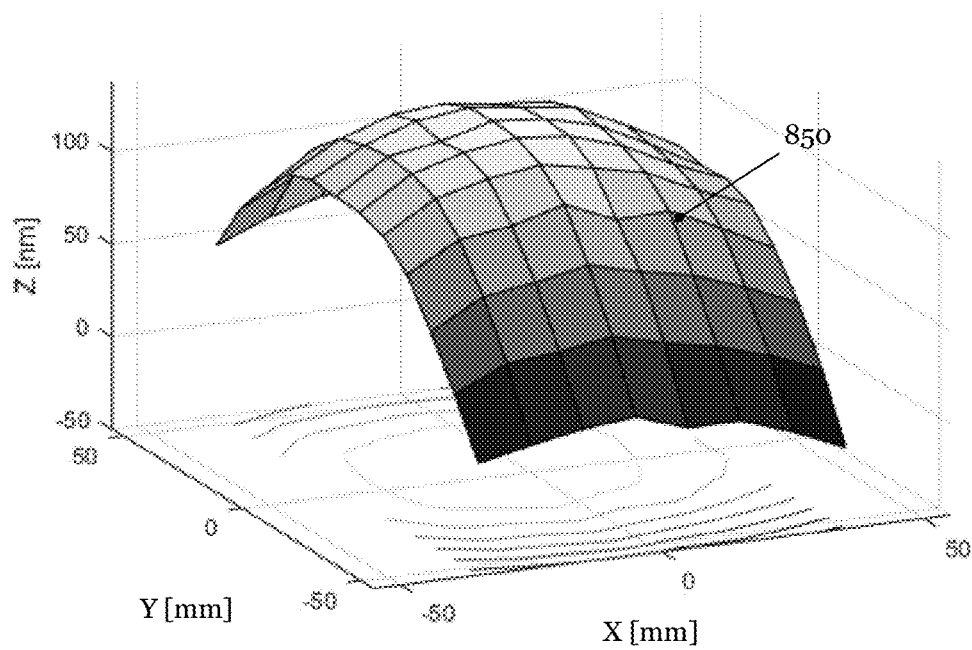
FIG. 8 illustrates a height profile of a curved EUV mask which was determined on the basis of a three-dimensional data record from the measurement apparatus in FIG. 6.

A third embodiment for ascertaining the change(s) 390, 550 in the measurement data 640 during the transition from the first surroundings 150 to second surroundings 350 is based on a three-dimensional data record for the pattern elements 360 of the EUV mask, measured by the measurement apparatus 600. FIG. 8 presents a three-dimensional representation of the measurement data 640 of the EUV mask 300, which were recorded with the aid of the measurement apparatus 600. In the example illustrated in FIG. 8, the maximum height difference of the measured height profile 850 over the EUV mask 300 is 138 nm. In the art, the curvature, the bend or the sag is referred to as the bow or mask bow. The maximum height difference of the height profile 850 is denoted by PV, standing for peak to valley, in the art. On the basis of the height profile 850 of the EUV mask 300 illustrated in FIG. 8, it is possible to determine, firstly, the local slope $$\frac{\Delta z}{\Delta x}$$

and, secondly, the change k in the neutral fiber 510 according to equation (2) from the height profile of the EUV mask 300. Since, unlike the second embodiment described above, the third embodiment is based on a three-dimensional data record, the third embodiment in question supplies more precise changes 390, 550 in respect of the measurement data 640 determined in relation to the first surroundings 150 than the second embodiment.

In a further, fourth embodiment, the measurement data 640 for determining the positions of the pattern elements 360 of the EUV mask 300 are determined in the second surroundings 350 rather than in the first surroundings 150. The advantage of this embodiment lies in the fact that a change in the measurement data 640, for example the placement data of the pattern elements 360 of the EUV mask 300, is not necessary in respect of the operating surroundings of the EUV mask 300. By contrast, a disadvantage of this embodiment is that even conventional transmissive photomasks can only be measured in reflection.

Figure 9:
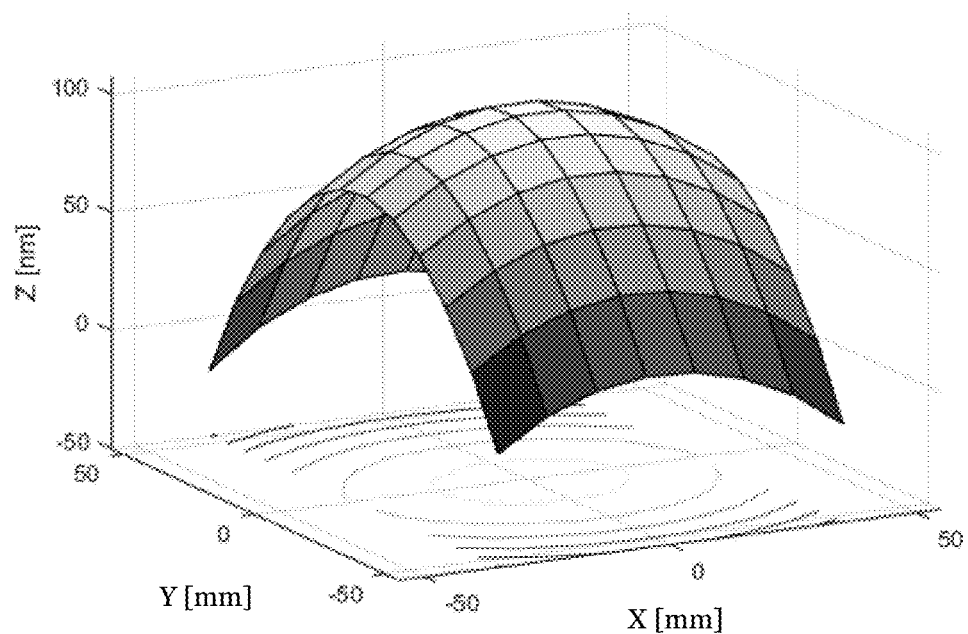
FIG. 9 presents a second-order fit to the height profile in FIG. 8.
Figure 10:
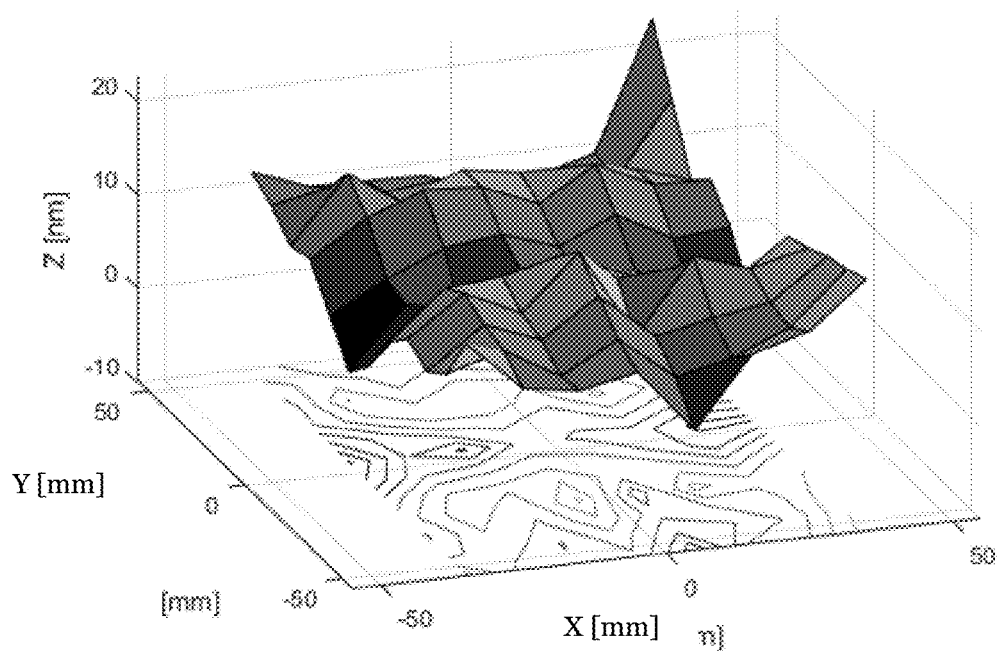
FIG. 10 shows a mask flatness of the EUV mask in FIG. 8 after the second-order fit from FIG. 9 was subtracted from the measured height profile.

Finally, determining OPD on the basis of equation (1) is discussed on the basis of the subsequent FIGS. 9 and 10. Now, the mask bow, the mask 300 flatness and the rear-side local slope of the EUV mask 300 is ascertained from the measured height profile 850, which is reproduced in FIG. 8, on the basis of the evaluation unit 660 of the measurement apparatus 600. In the art, the rear-side local slope is referred to as local slope. FIG. 9 shows an adaptation or a second-order fit $Z_{Fit}$ to the measured height profile 850 $Z_{Meas}$ of FIG. 8:

$$Z_{Fit} = a + b \cdot x + c \cdot y + d \cdot x \cdot y + e \cdot x^2 + f \cdot y^2 \quad (3)$$

The curvature of the EUV mask 300 (mask bow) emerges from the PV value of the fit up to the second order. In the exemplary second-order fit illustrated in FIG. 9, the height difference over the surface of the EUV mask 300 is 107 nm The front-side flatness $Z_{Front}$ of the EUV mask 300 (mask flatness) emerges from the difference of the measured height profile and the second-order fit specified above: $Z_{Front} = Z_{Mease} - Z_{Fit}$. FIG. 10 shows the flatness of the EUV mask 300 after subtracting the adaptation specified in FIG. 9. The flatness of the EUV mask 300 determined thus still has a height difference of 19 nm (PV value).

The local slope is defined as:

$$\text{local slope} = \frac{\Delta Z_{Front}}{\Delta x}, \quad (4)$$

where $\Delta x$ denotes the distance of the grid points of the second-order fit in FIG. 9. Further, FIG. 10 reproduces the slopes of the individual rectangles of the flatness area, i.e. the local slope in FIG. 9. The maximum slope is 1.36 µrad in the x-direction and 0.66 µrad in the y-direction.

Figure 11:
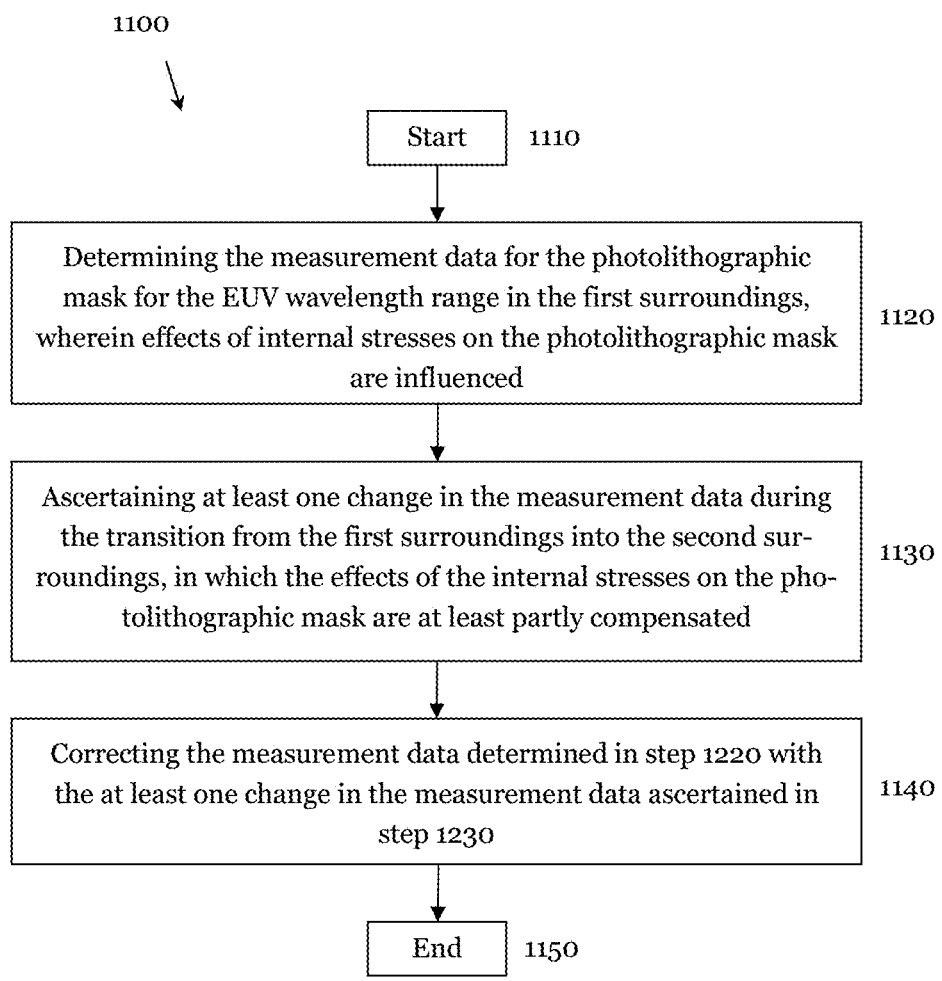
FIG. 11 illustrates a flowchart of a method for transforming measurement data of a photolithographic mask for the EUV wavelength range from first surroundings into second surroundings.

Finally, the flowchart 1100 of FIG. 11 provides an overview of the procedure of a method for transforming measurement data 640 of a photolithographic mask 300 for the extreme ultraviolet (EUV) wavelength range from first surroundings 150 into second surroundings 350. The method begins in step 1110. In step 1120, measurement data 640 for the photolithographic mask 300 for the EUV wavelength range in the first surroundings 150 are determined, wherein the measurement data 640 are influenced by the effects of internal stresses on the photolithographic mask. To this end, use can be made of, for example, the measurement apparatus 600.

In the next step 1130, at least one change 390, 450, 550 in the measurement data 640 during the transition from the first surroundings 150 into the second surroundings 350 is determined, wherein the effects of the internal stresses on the photolithographic mask 300 in the second surroundings 350 are at least partly compensated. By way of example, this step can be carried out by an evaluation unit 660 of the measurement apparatus 600.

Moreover, the measurement data 640 determined in step 1120 are corrected with the at least one change 390, 450, 550 in the measurement data 640 ascertained in step 1130. This step can likewise be carried out by the evaluation unit 660 of the measurement apparatus 600. Finally, the method ends with step 1150.

What is claimed is:

1. A method for transforming measurement data of a photolithographic mask for the extreme ultraviolet (EUV) wavelength range from first surroundings into second surroundings, wherein the method includes the steps of:
   a. determining the measurement data for the photolithographic mask in the first surroundings, wherein the measurement data are influenced by the effects of internal stresses on the photolithographic mask;
   b. ascertaining at least one change in the measurement data during the transition from the first surroundings into the second surroundings, in which the effects of the internal stresses on the photolithographic mask are at least partly compensated, wherein ascertaining the at least one change in the measurement data comprises: ascertaining a change in spatial orientation of a neutral fiber of the photolithographic mask during the transition from the first surroundings to the second surroundings; and
   c. correcting the measurement data determined in step a. with the at least one change in the measurement data ascertained in step b.

2. The method according to claim 1, wherein determining the measurement data comprises determining coordinates of pattern elements on a surface of the photolithographic mask and/or determining the measurement data comprises determining a surface contour of the photolithographic mask.

3. The method according to claim 2, wherein determining the surface contour of the photolithographic mask is effectuated at the same time as determining the coordinates of pattern elements or wherein the surface contour is determined in a separate measurement.

4. The method according to claim 1, wherein the first surroundings comprise measurement surroundings in which the photolithographic mask is anchored by a three-point mount.

5. The method according to claim 4, furthermore including the step of: determining a gravitational effect of the photolithographic mask by way of a finite element simulation and taking account of the gravitational effect when ascertaining the at least one change in the measurement data in step b.

6. The method according to claim 1, wherein the first surroundings comprise measurement surroundings in which the photolithographic mask is anchored by a chuck.

7. The method according to claim 1, wherein the second surroundings comprise an EUV lithography apparatus in which the photolithographic mask is anchored by a chuck.

8. The method according to claim 6, wherein the anchoring of the photolithographic mask substantially produces a planar area of a rear-side surface of the photolithographic mask.

9. The method according to claim 1, wherein determining the measurement data for the photolithographic mask in the first surroundings comprises: irradiating the photolithographic mask with a photon beam and/or an electron beam.

10. The method according to claim 1, wherein ascertaining the change in spatial orientation of the neutral fiber comprises ascertaining a change in a magnification of the photolithographic mask in the first surroundings with respect to the second surroundings.

11. The method according to claim 10, wherein ascertaining the change in a magnification comprises determining an isotropic magnification factor and/or determining at least two magnification factors which capture an anisotropic magnification of the photolithographic mask in the first surroundings.

12. The method according to claim 1, wherein ascertaining the change in spatial orientation of the neutral fiber comprises: reading the change in spatial orientation of the neutral fiber from a database which comprises the spatial orientations of the neutral fibers of different mask types.

13. The method according to claim 1, wherein ascertaining the change in spatial orientation of the neutral fiber comprises: carrying out a finite element simulation of the photolithographic mask in the first surroundings for determining the change in spatial orientation of the neutral fiber.

14. The method according to claim 1, wherein ascertaining the at least one change in the measurement data comprises: determining a change in the magnification of the photolithographic mask in the first surroundings in respect of a predetermined magnification.

15. The method according to claim 1, wherein ascertaining the at least one change comprises: determining a change in the magnification of the photolithographic mask by a magnification compensation of a measurement apparatus for determining the change in spatial orientation of the neutral fiber of the photolithographic mask in the first surroundings.

16. The method according to claim 1, wherein the measurement data are determined after producing pattern elements on a mask surface and/or after producing at least one black border in the active region of the photolithographic mask.

17. The method according to claim 1, wherein ascertaining the at least one change in the measurement data comprises: determining a height difference of a photolithographic mask.

18. A computer program stored in a non-transitory memory and containing instructions which, when executed by a computer system, prompt the computer system to carry out the method steps of claim 1.

19. An evaluation unit for an apparatus for measuring a placement of pattern elements of a photolithographic mask for the extreme ultraviolet (EUV) wavelength range, said evaluation unit being embodied to carry out the method steps of claim 1.

* * * * *

UNITED STATES PATENT AND TRADEMARK OFFICE
CERTIFICATE OF CORRECTION

PATENT NO. : 11,243,464 B2
APPLICATION NO. : 16/547662
DATED : February 8, 2022
INVENTOR(S) : Carola Blaesing-Bangert It is certified that error appears in the above-identified patent and that said Letters Patent is hereby corrected as shown below:

On the Title Page

Page 2
Column 2 (Other Publications), Line 15, delete "Micro/Nanolithographv" and insert
-- Micro/Nanolithography --

In the Specification

Column 17
Line 14, delete "$Z_{Front} = Z_{Mease} - Z_{Fit}$" and insert -- $Z_{Front} = Z_{Meas} - Z_{Fit}$ --

Signed and Sealed this
Nineteenth Day of July, 2022

Katherine Kelly Vidal
*Director of the United States Patent and Trademark Office*